United States Patent [19]

Sueyoshi et al.

[11] 4,420,725
[45] Dec. 13, 1983

[54] WIDE-BANDWIDTH LOW-DISTORTION AMPLIFIER

[75] Inventors: Susumu Sueyoshi; Kikuo Ishikawa, both of Tokyo, Japan

[73] Assignee: Pioneer Electronic Corporation, Tokyo, Japan

[21] Appl. No.: 189,276

[22] Filed: Sep. 22, 1980

Related U.S. Application Data

[63] Continuation-in-part of Ser. No. 105,333, Dec. 19, 1979, abandoned.

[30] Foreign Application Priority Data

Dec. 27, 1978 [JP] Japan ............................ 53/163895
Dec. 29, 1978 [JP] Japan ............................ 53/165071
Sep. 21, 1979 [JP] Japan ............................ 54/121645

[51] Int. Cl.³ .................................................. H03F 3/18
[52] U.S. Cl. ................................... 330/288; 330/293; 330/299; 330/311
[58] Field of Search ............... 330/257, 288, 293, 299, 330/311; 323/315, 316

[56] References Cited

U.S. PATENT DOCUMENTS

4,103,248  7/1978  Idei ..................................... 330/288
4,228,404 10/1980  Widlar ........................... 330/288 X

OTHER PUBLICATIONS

McClellan, "Current Source and 555 Timer Make Linear V-to-F Converter", *Electronics*, Jun. 10, 1976, pp. 108, 109.

*Primary Examiner*—James B. Mullins
*Attorney, Agent, or Firm*—Sughrue, Mion, Zinn, Macpeak, and Seas

[57] ABSTRACT

A low-noise wide-band bipolar transistor amplifier in which distortion caused by non-linear transistor operating characteristics is substantially eliminated. An input signal is coupled to the base of a first transistor connected in an emitter follower configuration with the signal formed at the emitter of the first transistor coupled to the base of a second transistor. Currents are supplied to the first and second transistors by a current mirror circuit in such a manner that a ratio of the current supplied to the first transistor to the current supplied to the second transistor is made constant. An output signal is produced in response to current variations in a transistor of the current mirror circuit which supplies current to the second transistor.

8 Claims, 5 Drawing Figures

WIDE-BANDWIDTH LOW-DISTORTION AMPLIFIER

CROSS-REFERENCE

This is a continuation-in-part application of Ser. No. 105,333, filed Dec. 19, 1979, now abandoned.

BACKGROUND OF THE INVENTION

The present invention relates to amplifiers and more particularly to a wide band amplifier using bipolar transistors.

For an amplifier intended for amplifying a wide bandwidth signal such as a video signal, it is necessary to minimize the amplifier's distortion. For this purpose, a technique for suppressing distortion by employing negative fedback has been extensively used. However, negative feedback cannot be employed without decreasing the amplification factor. Accordingly, in order to obtain a desired amplification factor, it is necessary to use a number of amplifying elements or amplifier circuits. In this case, the stability of the entire amplifier circuit is lowered, which may result in oscillation.

The input and output characteristic between the base and emitter of a transistor used as an amplifying element is non-linear. In order to overcome the non-linearity, a technique wherein a large current is used and a technique in which negative feedback is employed have been used. However, none of these have been found to be totally acceptable. Especially, the negative feedback technique still involves the above-described difficulties.

Accordingly, an object of this invention is to provide a transistor amplifier in which the non-linear distortion of transistors is eliminated without employing negative feedback.

SUMMARY OF THE INVENTION

In an amplifier according to one preferred embodiment of the invention, two transistors opposite in conductivity to each other are connected in such a manner that preferably one of the transistors is connected as an emitter follower transistor while the other is connected to amplify the emitter follower output. Current supplying means such as a current mirror circuit supplies currents to the two transistors as the emitter load and the collector load of the two transistors so that an amplified output is provided between the reference potential point and the emitter transistor of a transistor which is collector load of the aforementioned amplifying transistor of the transistors forming the current mirror circuit. The current supplying means supplies the currents $I_1$ and $I_2$ to the emitter follower transistor and the amplifying transistor, respectively, the ratio $I_1/I_2$ of which is constant ($I_1/I_2 = 1/\alpha$ where $\alpha$ is constant). The constant $\alpha$ may of course be selected to be 1 so that the current is equally applied to the two transistors.

In an amplifier according to another preferred embodiment of the invention, two transistors opposite in conductivity to each other and an output resistor as an output conversion means are employed. A first one of the two transistors is connected as an emitter follower transistor while the second is connected to amplify the emitter follower output. In addition, a current mirror circuit is provided as the emitter load of the first transistor and as the collector load of the second transistor. The current mirror circuit supplies currents respectively to the two transistors and the output resistor in such a manner that a ratio of the current supplied to the first transistor to that supplied to the second one is constant and further a ratio of the current supplied to the second transistor to that supplied to the output resistor is also constant. The output of the amplifier is developed across the output resistor.

DESCRIPTION OF THE PREFERRED EMBODIMENTS

The present invention will now be described with reference to the accompanying drawings.

Figure 1:
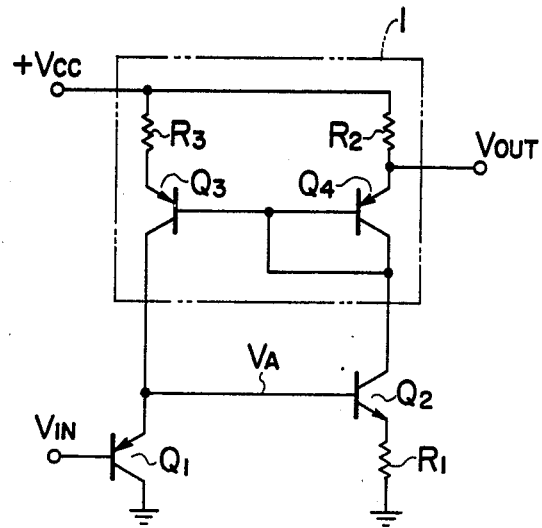
FIG. 1 is a circuit diagram showing a first embodiment of an amplifier according to the invention.

FIG. 1 is a circuit diagram showing a first preferred embodiment of an amplifier according to the invention. In this circuit, an input signal $V_{IN}$ is applied to the base of a PNP transistor $Q_1$ connected to form an emitter follower circuit and the emitter follower output of the transistor $Q_1$ is applied to the base of an NPN transistor $Q_2$ in the following stage. A current mirror circuit 1 is provided as the emitter load of the transistor $Q_1$ and as the collector load of the transistor $Q_2$. The current mirror circuit 1 is composed of PNP transistors $Q_3$ and $Q_4$ whose bases are connected to each other and emitter resistors $R_2$ and $R_3$ which are connected to the emitters of the transistors $Q_4$ and $Q_3$, respectively. The transistor $Q_4$ is diode-connected, that is, its base is connected to its collector. The thus constructed current mirror circuit 1 supplies currents $I_1$ and $I_2$ to the transistors $Q_1$ and $Q_2$, respectively, the ratio $I_1/I_2$ of which is constant ($I_1/I_2 = 1/\alpha$ where $\alpha$ is constant). The ratio $1/\alpha$ of the currents which are supplied to the transistors $Q_1$ and $Q_2$ is set to a desired constant value by appropriately selecting the values of the resistors $R_2$ and $R_3$. If the resistances of the resistors $R_2$ and $R_3$ are selected to be equal to each other, then substantially equal currents are supplied from the collectors of the transistors $Q_3$ and $Q_4$ to the emitter follower transistor $Q_1$ and the amplifying transistor $Q_2$, respectively.

An emitter resistor $R_1$ is connected between the emitter of the amplifying transistor $Q_2$ and ground. An amplified output is developed across the resistor $R_2$.

If, in this circuit, the base-emitter voltages of the transistors $Q_1$ and $Q_2$ are represented by $V_{BE1}$ and $V_{BE2}$, respectively, the voltage at the emitter of the transistor $Q_1$ is represented by $V_A$ and the current flowing in the transistors $Q_1$ and $Q_2$ are represented by $I_1$ and $I_2$, respectively, then the following equations can be established:

$$V_A = V_{IN} + V_{BE1} \tag{1}$$

$$I_2 = (V_A - V_{BE2})/R_1 \tag{2}$$

$$V_{OUT} = I_2 \cdot R_2 \tag{3}$$

From equations (1) to (3), the following equation is established:

$$V_{OUT}=(V_{IN}+V_{BE1}-V_{BE2})\cdot(R_2/R_1) \qquad (4)$$

In general, the relation between the collector current $I_C$ of a transistor and the base-emitter voltage $V_{BE}$ is represented as follows:

$$I_C=I_S(\exp(qV_{BE}/kT)-1) \qquad (5)$$

where q is the electron charge, k is Boltzmann's constant, T is absolute temperature, and $I_S$ is the base-emitter reverse saturation current.

From equation (5), $V_{BE}$ in equation (1) is:

$$V_{BE}=(kT/q)ln(I_C/I_S+1) \qquad (6)$$

$(V_{BE1}-V_{BE2})$ in equation (1) is:

$$V_{BE1}-V_{BE2}=(k/q)\{T_1 ln(I_1/I_{S1}+1)-T_2 ln(\alpha I_1/I_{S2}+1), \qquad (7)$$

where $T_1$ is the base-emitter junction temperature of the transistor $Q_1$ and $T_2$ is the base-emitter junction temperature of the transistor $Q_2$.

Since $I_S$ is a fixed constant value specific to each transistor, $I_{S2}=\beta I_{S1}$ where $\beta$ is constant. Since the value $I_S$ is small compared with the collector current $(I_C/I_S>>1)$, the following equation (8) is established:

$$(I_C/I_S+1)\approx I_C/I_S \qquad (8)$$

Equation (7) can be rewritten into the following equation (9) by using equation (8) above:

$$V_{BE1}-V_{BE2}\approx(k/q)\{T_1 ln(I_1/I_{S1})-T_2 ln(\alpha I_1/\beta I_{S1})\} \qquad (9)$$

In equation (9), provided that the junction temperature of the transistor is constant, then the following equation (10) is obtained:

$$V_{BE1}-V_{BE2}=(kT/q)ln(\beta/\alpha) \qquad (10)$$

In the above equation, since the value $(V_{BE1}-V_{BE2})$ is constant, equation (4) can be simply expressed as follows; where $(V_{BE1}-V_{BE2})$ is replaced by $\gamma$.

$$V_{OUT}=(V_{IN}+\gamma)\cdot(R_2/R_1) \qquad (11)$$

As can be appreciated from equation (11), the output voltage $V_{OUT}$ is completely independent of the base-emitter voltage $V_{BE}$ of each transistor. Input $V_{IN}$ is boosted by an amplification factor depending on the ratio of the resistance $R_2$ to the resistance $R_1$. This is attributed to the fact that the effects of the non-linearities of the transistors $Q_1$ and $Q_2$ due to the base-emitter voltages thereof are eliminated by making constant the ratio of currents flowing in the transistors $Q_1$ and $Q_2$.

Although description has been made with respect to the case where the ratio of the current $I_1$ flowing in the emitter follower transistor $Q_1$ to the current $I_2$ flowing in the amplifying transistor $Q_2$ is constant $(I_1/I_2=1/\alpha)$, the foregoing description is also true for the case where the current $I_1$ is made to be equal to the current $I_2$ by the current mirror circuit 1. Specifically, in this case also, the output $V_{OUT}$ is independent of the base-emitter voltage $V_{BE}$ of each transistor, because it can be considered that $V_{BE1}$ of the transistor $Q_1$ is equal to $V_{BE2}$ of the transistor $Q_2$.

The currents flowing in the various elements in the circuit shown in FIG. 1 will now be described in detail.

If it is assumed that the currents flowing in the resistors $R_2$ and $R_3$ are equal to each other, each being represented by $I_E-2I_B$ where $I_B$ is the base current of each transistor, then the collector currents of the transistors $Q_3$ and $Q_4$ are equal to each other, each being $I_E-3I_B$. The collector current $I_E-3I_B$ of the transistor $Q_4$ is added to the base currents $2I_B$ of the two transistors and the resultant current $I_E-I_B$ is applied to the collector of transistor $Q_2$. Accordingly, the emitter current of the transistor $Q_2$ can be expressed by $I_E$. On the other hand, from the collector current $I_E-3I_B$, the current $I_B$ is employed as the base current of the transistor $Q_2$ while the remaining current $I_E-4I_B$ flows as the emitter current of the transistor $Q_1$.

Accordingly, the emitter current of the two transistors $Q_1$ and $Q_2$ are $I_E-4I_B$ and $I_E$, respectively. That is, the difference between the emitter currents is $4I_B$. As a result, the base-emitter voltages of the two transistors are not completely equal to each other and the effects of the non-linearities thereof are not completely eliminated. However, in practice this can be neglected.

Figure 2:
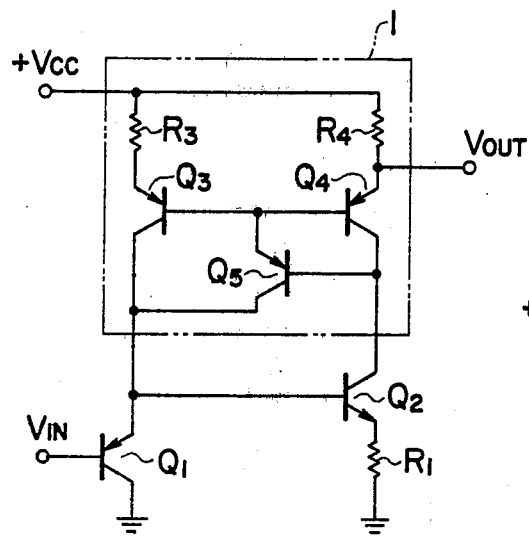
FIG. 2 is a circuit diagram showing a second embodiment of an amplifier according to the invention.

A circuit intended for completely cancelling the non-linearities is shown in FIG. 2, in which those components which have been described with reference to FIG. 1 are therefore similarly designated. Only components different from those in FIG. 1 will be described. In FIG. 1, the transistor $Q_4$ is diode-connected. However, in the circuit shown in FIG. 2, a PNP transistor $Q_5$ is additionally provided and the base and the collector of the transistor $Q_4$ are connected to the emitter and the base of the transistor $Q_5$, respectively. Furthermore, the collector of the transistor $Q_5$ is connected to the collector of the transistor $Q_3$.

Accordingly, by means of the transistor $Q_5$, the base currents $2I_B$ of the transistors $Q_3$ and $Q_4$ are added to the collector current of the transistor $Q_3$ at the collector of the transistor $Q_3$ to provide a current $I_E-I_B$. From the current $I_E-I_B$, the current $I_B$ is employed as the base current of the transistor $Q_2$ while the remaining current $I_E-2I_B$ flows as the emitter current of the transistor $Q_1$.

If the current amplification factor of the transistor $Q_5$ is large, the base current of the transistor will accordingly be small so that it can be neglected. Thus, in this case, the collector current $I_E-3I_B$ of the transistor $Q_4$ substantially completely flows in the collector of the transistor $Q_2$. Therefore, the emitter current of the transistor $Q_2$ is $I_E-2I_B$ which is exactly equal to that of the transistor $Q_1$ and accordingly the base-emitter voltages of the two transistors are equal to each other. Thus, with the aid of the transistor $Q_5$, the base currents of the transistors whose bases are connected to each other in the current mirror circuit 1 are supplied to the collector of the transistor $Q_3$ and accordingly to the emitter of the transistor $Q_1$ so that the effects of non-linearities due to the base-emitter voltages $V_{BE}$ of the emitter follower transistor $Q_1$ and the amplifying transistor $Q_2$ are completely eliminated.

Figure 3:
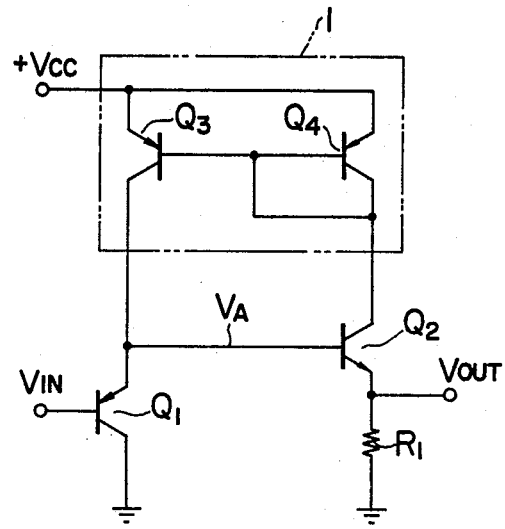
FIG. 3 is a circuit diagram showing a third embodiment of an amplifier according to the invention.

FIG. 3 shows a third embodiment of an amplifier according to the present invention in which the components which have been described with reference to FIG. 1 are similarly designated. In this embodiment, an output $V_{OUT}$ is developed across the emitter resistor $R_1$ of the transistor $Q_2$ and both the transistors $Q_1$ and $Q_2$ are connected to form emitter follower circuits so that the gain of the amplifier is 1. In order to set a ratio of the currents flowing in the transistors $Q_1$ and $Q_2$ to be a desired value, a ratio of an emitter area of the transistor $Q_3$ to that of the transistor $Q_4$ is set to be a desired value while removing the resistors $R_2$ and $R_3$.

In this circuit, the output $V_{OUT}$ is expressed by the following equation:

$$V_{OUT} = V_{IN} + V_{BE1} - V_{BE2} \quad (12)$$

Furthermore, the value $(V_{BE1} - V_{BE2})$ is expressed by the equation (10) similar to the embodiment shown in FIG. 1. Therefore, equation (12) is rewritten as follows:

$$V_{OUT} = V_{IN} + \gamma \quad (13)$$

where $\gamma$ is a constant value representing $(V_{BE1} - V_{BE2})$.

Accordingly, the amplifier according to the third embodiment acts as a buffer amplifier which has an offset voltage $\gamma$ and a gain 1. This amplifier is also advantageous in that it is free from distortion caused by the emitter-base voltage $V_{BE}$ of each of the transistors.

In the above embodiments, a resistor element may be provided between the collector of the transistor $Q_2$ and the current mirror circuit 1 so that the output voltage can be developed thereacross. Furthermore, the resistor element may be provided between the collector of the transistor $Q_1$ and ground or between the emitter of the transistor $Q_1$ and the current mirror circuit 1. In the embodiments shown in FIGS. 1 and 2, the resistor $R_3$ is also available to derive the output voltage therefrom.

Figure 4:
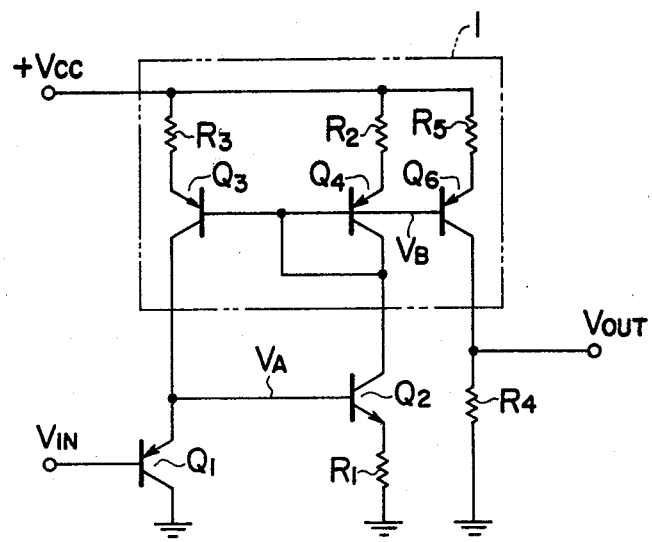
FIG. 4 is a circuit diagram showing a fourth embodiment of an amplifier according to the invention.

FIG. 4 shows a fourth embodiment of an amplifier according to the present invention which is suitable for obtaining a larger gain of amplification. The components similar to those shown in FIG. 1 are designated by similar characters or symbols. The current mirror circuit 1, as shown in FIG. 4, includes PNP transistors $Q_3$, $Q_4$ and $Q_6$ and resistors $R_2$, $R_3$ and $R_5$ connected respectively to the emitters of the transistors $Q_4$, $Q_3$ and $Q_6$. The bases of the transistors $Q_4$, $Q_3$ and $Q_6$ are connected commonly to one another. The transistor $Q_4$ is diode-connected. That is, its base is connected to its collector. In this circuit arrangement, currents $I_1$ and $I_2$ respectively in the transistors $Q_1$ and $Q_2$ are set so that a ratio of $I_1/I_2$ is $1/\alpha$ where $\alpha$ is constant and a ratio of the current $I_2$ to current $I_3$ flowing in the resistor $R_4$ is set to be $1/\alpha'$ where $\alpha'$ is constant.

In the circuit arrangement according to the fourth embodiment, equations (1) and (2) are also established and the voltage $V_B$ on the common base line of the transistors in the current mirror circuit 1 is:

$$V_B = V_{CC} - V_{BE4} - I_2 R_2 \quad (14)$$

If the equation (14) is rearranged using the equations (1) and (2), then:

$$V_B = V_{CC} - V_{BE4} - (R_2/R_1)(V_{IN} + V_{BE1} - V_{BE2}) \quad (15)$$

Furthermore, the current $I_3$ can be represented by the following equation (16):

$$I_3 = (V_{CC} - V_{BE6} - V_B)/R_5 \quad (16)$$

Therefore, the output $V_{OUT}$ of the circuit is:

$$V_{OUT} = I_3 \cdot R_4 = (R_4/R_5)(V_{CC} - V_{BE6} - V_B) \quad (17)$$

If the equation (15) is substituted into the equation (17), then:

$$V_{OUT} = (R_4/R_5)\{V_{BE4} - V_{BE6} + (R_2/R_1)(V_{IN} + V_{BE1} - V_{BE2})\} \quad (18)$$

In the equation (18), note that $(V_{BE1} - V_{BE2})$ is constant ($\gamma$) as is appreciated from the equation (10). Further, $(V_{BE4} - V_{BE6})$ is represented by:

$$V_{BE4} - V_{BE6} \approx (kT/q) \ln(\beta'/\alpha') \quad (19)$$

where $\beta'$ is a ratio of $I_S$ of transistor $Q_6$ to that of transistor $Q_4$. The equation (19) is also constant, and if the same is expressed by $\gamma'$, the equation (18) is rewritten as:

$$V_{OUT} = (R_4/R_5)\{\gamma' + (R_2/R_1)(V_{IN} + \gamma)\} \quad (20)$$

As is clear from the equation (20), the output $V_{OUT}$ is independent of the base-emitter voltage $V_{BE}$ of the transistors. Moreover, the output $V_{OUT}$ is obtained by boosting the input $V_{IN}$ by an amplification factor which is defined by the ratio of the resistances $R_1$ and $R_2$ and of the resistances $R_4$ and $R_5$.

The currents at various points in the circuit in FIG. 4 will now be described in more detail. if it is assumed that the current flowing in the resistors $R_2$ and $R_3$ are equal to each other, each being represented by $I_E - 2I_B$ where $I_B$ is the base current of each transistor, then the collector currents of the transistors $Q_3$ and $Q_4$ are equal to each other with each being represented by $I_E - 3I_B$. The collector current $I_E - 3I_B$ of the transistor $Q_4$ is added to the base currents $3I_B$ of the three transistors $Q_3$, $Q_4$ and $Q_6$ at the collector of the transistor $Q_2$. That is, a collector current $I_E$ is applied to the collector of the transistor $Q_2$. Accordingly, the emitter current of the transistor $Q_2$ is $I_E + I_B$. From the collector current $I_E 3I_B$, the current $I_B$ is employed as the base current of the transistor $Q_2$ while the remaining current $I_E - 4I_B$ flows as the emitter current of the transistor $Q_1$.

Thus, the emitter currents of the two transistors $Q_1$ and $Q_2$ are $I_E - 4I_B$ and $I_E + I_B$, respectively. Accordingly, the base-emitter voltages $V_{BE}$ of the two transistors are not completely equal to each other, as in the embodiment of FIG. 1, and accordingly, the effects of the non-linearities thereof are not completely eliminated. However, this can be neglected, in practice.

Figure 5:
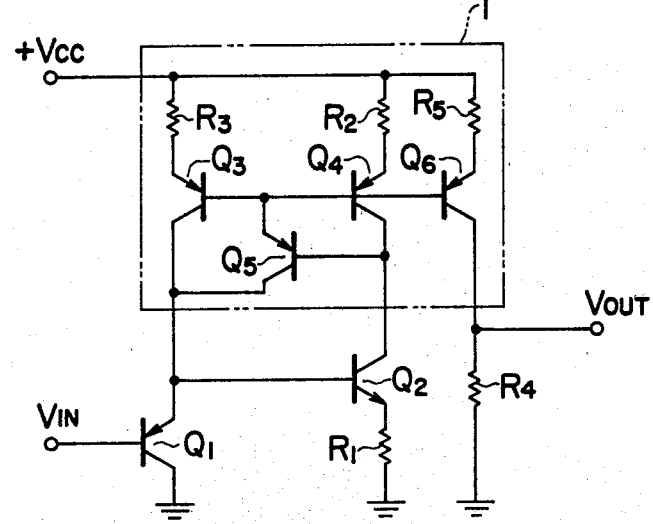
FIG. 5 is a circuit diagram showing a fifth embodiment of an amplifier according to the invention.

In order to more completely cancel the non-linearities, a circuit as shown in FIG. 5 may be provided according to the invention. In FIG. 5, those components which have been previously described with reference to FIGS. 1 to 4 are similarly designated. Only components which are different from those in FIG. 4 will be described.

In FIGS. 1 and 4, the transistor $Q_4$ is diode-connected. Instead of this, in the circuit shown in FIG. 5, a PNP transistor $Q_5$ whose emitter and base are connected respectively to the base and collector of the transistor $Q_4$ is provided. The collector of the transistor $Q_5$ is connected to the collector of the transistor $Q_3$.

Accordingly, by means of the transistor $Q_5$, the base currents $3I_B$ of the transistors $Q_3$, $Q_4$ and $Q_6$ are added to the collector current of the transistor $Q_3$ as a result of which a current $I_E$ is obtained. From the current $I_E$, the current $I_B$ is employed as the base current of the transistor $Q_2$ while the remaining current $I_E - I_B$ flows as the emitter current of the transistor $Q_1$.

If the current amplification factor of the transistor $Q_5$ is selected to be large, then the base current of the transistor is sufficiently small that it can be neglected. Therefore, substantially all of the collector current of the transistor Q₄ flows in the collector of the transistor Q₂. Accordingly, the emitter current of the transistor Q₂ is $I_E - 2I_B$. Thus, the difference between the emitter current of the transistor Q₂ and that of the aforementioned transistor Q₁ is only $I_B$ and therefore the base-emitter voltages $V_{BE}$ of the two transistors are more equal to each other than those in the circuit in FIGS. 1 and 4.

The circuit in FIG. 5 is so designed that, with the aid of the transistor Q₅, the base currents of the transistors whose bases are connected to one another in the current mirror circuit are applied to the collector of the transistor Q₃ and accordingly to the emitter of the transistor Q₁. Thus, the effects of the non-linearities of the emitter follower transistor Q₁ and the amplifying transistor Q₂ are completely eliminated.

As is clear from the above description, the invention provides a transistor amplifier of simple construction in which distortion is eliminated without negative feedback and which has a desired amplification factor.

What is claimed is:

1. An amplifier comprising:
   a first transistor to the base of which an input is applied, said first transistor being of a first conductivity type and having an emitter-collector current path for carrying a first emitter-collector current;
   a second transistor having a base to which an output of said first transistor is applied, said base of said second transistor having a base current, said second transistor being of a second conductivity type opposite to said first conductivity type of said first transistor having an emitter-collector current path for carrying a second emitter-collector current;
   current supplying means for providing a first current at a first current terminal connected in common to said emitter-collector path of said first transistor and to said base of said second transistor whereby said first current is substantially equal to the sum of said base current of said second transistor and said first emitter-collector current of said first transistor, and for providing a second current at a second current terminal connected to said emitter-collector current path of said second transistor, whereby said second current is substantially equal to said second emitter-collector current, a ratio of said first and second currents being constant; and
   output means for providing an output voltage corresponding to variations in the current supplied to said second transistor.

2. The amplifier as claimed in claim 1, in which said current supplying means comprises: third and fourth transistors having bases carrying base currents and connected to each other and each having an emitter-collector path providing respective emitter-collector currents to said first and second current terminals, respectively; and means for forming a base current supplying path for supplying the base currents of said third and fourth transistors to said first current terminal for combination with said emitter-collector current of said third transistor to obtain said first current.

3. The amplifier as claimed in claim 2 in which said means for forming a base current suppling path comprises: a fifth transistor having a base connected to the collector of said fourth transistor, an emitter connected to the bases of said third and fourth transistors and a collector connected to said first current terminal.

4. The amplifier as claimed in claim 1, wherein said current supplying means includes a third current terminal and provides a third current at said third current terminal having a constant ratio to said second current, said output means providing an output voltage corresponding to the level of said third current.

5. The amplifier as claimed in claim 4 in which said current supplying means comprises: a current mirror circuit for supplying currents respectively to all of said first, second and third current terminals.

6. The amplifier as claimed in claim 5 wherein said current mirror circuit comprises: third and fourth transistors having collectors connected respectively to said first and second current terminals, bases connected to one another, and emitters each connected through a respective resistor to a reference potential point.

7. The amplifier as claimed in claim 6 further comprising: a fifth transistor having an emitter connected to the bases of said third and fourth transistors, a base connected to the collector of said fourth transistor and a collector coupled to the collector of said third transistor.

8. The amplifier as claimed in claim 6 wherein said current supplying means further comprises: a fifth transistor having a base connected to the bases of said third and fourth transistors, an emitter connected through a resistor to said reference potential point and a collector connected to said third current terminal, said output means comprising a resistor connected in series between said third current terminal and ground, said output being formed at said collector of said fifth transistor.

* * * * *